(12) United States Patent
Huang et al.

(10) Patent No.: US 8,963,282 B2
(45) Date of Patent: Feb. 24, 2015

(54) CRACK STOP STRUCTURE AND METHOD FOR FORMING THE SAME

(75) Inventors: Tse-Yao Huang, Taipei (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 203 days.

(21) Appl. No.: 13/231,961

(22) Filed: Sep. 14, 2011

(65) Prior Publication Data

US 2013/0062727 A1   Mar. 14, 2013

(51) Int. Cl.
*H01L 29/72* (2006.01)
*H01L 23/31* (2006.01)
*H01L 23/00* (2006.01)
*H01L 21/78* (2006.01)
*H01L 21/56* (2006.01)

(52) U.S. Cl.
CPC .......... *H01L 23/3178* (2013.01); *H01L 23/562* (2013.01); *H01L 21/78* (2013.01); *H01L 21/561* (2013.01); *H01L 2924/0002* (2013.01)
USPC ............... 257/506; 257/E21.546; 257/E29.02

(58) Field of Classification Search
USPC .............................. 257/506, E21.546, E29.02
See application file for complete search history.

(56) References Cited

U.S. PATENT DOCUMENTS

| | | |
|---|---|---|
| 2007/0096092 A1 | 5/2007 | Huang |
| 2008/0136026 A1* | 6/2008 | Yang .............................. 257/738 |
| 2008/0230874 A1* | 9/2008 | Yamada et al. ................ 257/620 |
| 2010/0258899 A1* | 10/2010 | Huang et al. ................... 257/484 |
| 2013/0147018 A1* | 6/2013 | Chen et al. ..................... 257/620 |

FOREIGN PATENT DOCUMENTS

TW   201025442   7/2010

* cited by examiner

*Primary Examiner* — Edward Wojciechowicz
(74) *Attorney, Agent, or Firm* — Winston Hsu; Scott Margo

(57) ABSTRACT

A semiconductor structure includes a matrix, an integrated circuit and a scribe line. The matrix includes a scribe line region and a circuit region. The integrated circuit is disposed within the circuit region. The scribe line is disposed within the scribe line region and includes a crack stop trench which is disposed in the matrix and adjacent to the circuit region. The crack stop trench is parallel with one side of the circuit region and filled with a composite material in a form of a grid to form a crack stop structure.

10 Claims, 18 Drawing Sheets

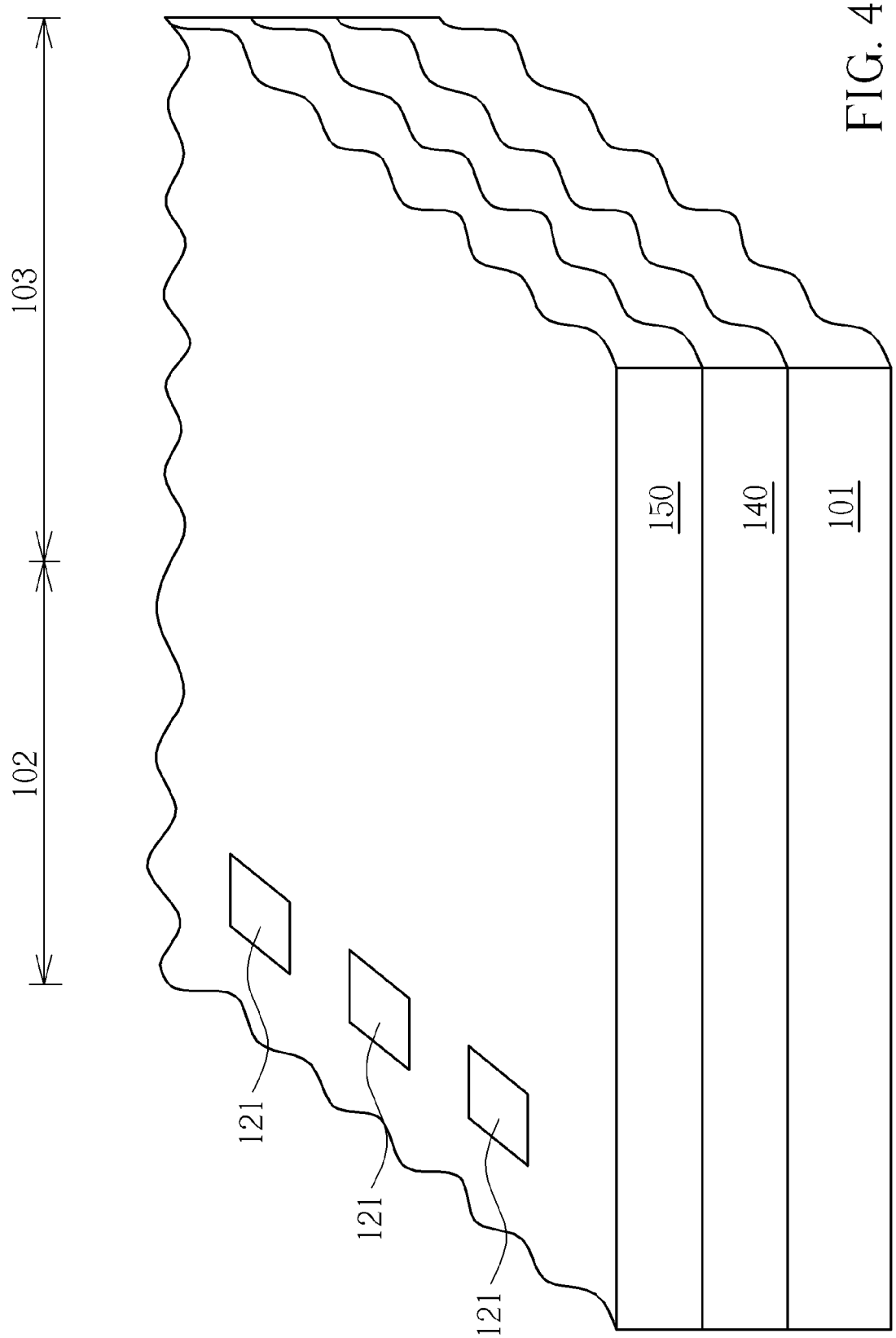

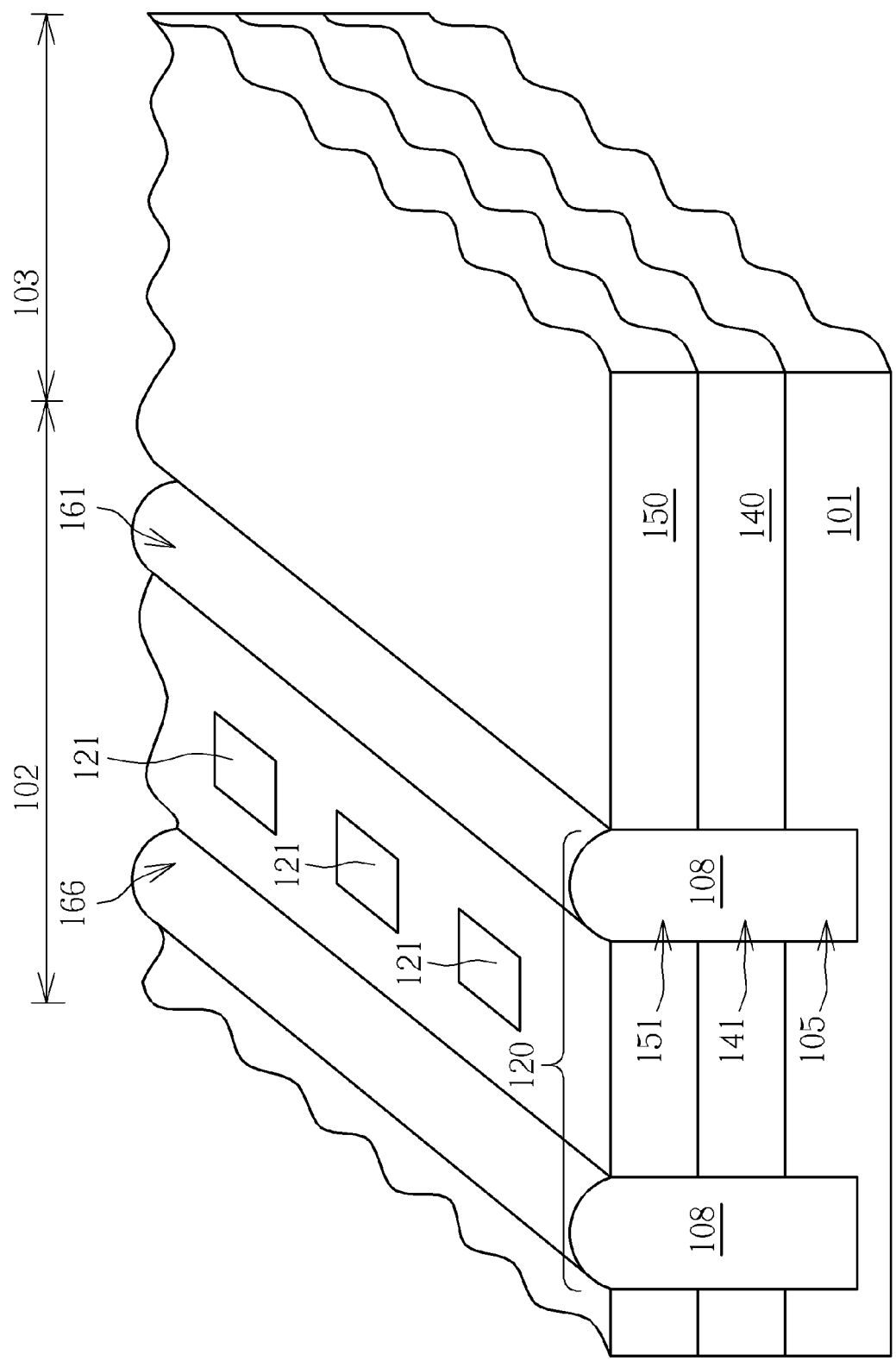

CRACK STOP STRUCTURE AND METHOD FOR FORMING THE SAME

BACKGROUND OF THE INVENTION

1. Field of the Invention

The present invention generally relates to a crack stop structure and a method for forming a crack stop structure in a scribe line. In particular, the present invention is directed to a crack stop structure filled with s single dielectric material and a method for forming the crack stop structure in a scribe line.

2. Description of the Prior Art

Semiconductor manufacturers have been trying to shrink the size of transistors in integrated circuits (IC) in order to improve chip performance. This has resulted in an increased speed and device density. For sub-micron technology, the RC delay becomes the dominant factor. To facilitate further improvements, semiconductor IC manufacturers have been forced to turn to new materials for reducing the RC delay by either lowering the interconnect wire resistance, or by reducing the capacitance of the inter-layer dielectric (ILD) material. A significant improvement was achieved by replacing aluminum (Al) interconnects with copper, which has ~30% lower resistivity than that of Al. Further advances may be accomplished by the substitution of other low-k dielectric materials.

In prior art aluminum interconnect technology, where Al forms a self-passivating oxide layer, a crack stop is formed to prevent cracks from traversing the BEOL dielectrics into the IC chip. However, one disadvantage associated with the use of low-k dielectrics is that almost all low-k dielectric materials possess a relatively lower mechanical strength than that of conventional silicon oxide dielectrics such as FSG or USG.

The use of low-k dielectrics poses another problem for the industry in that the adhesion ability, either at the interface between two adjacent low-k dielectric layers or at the interface between a low-k dielectric layer and a dissimilar dielectric layer, is inadequate to meet the requirements of subsequent wafer treatment processes such as wafer dicing, which is typically performed to mechanically cut a semiconductor wafer into a number of individual IC chips.

The technology of dicing has been developed to a high standard. One restriction of dicing is that cracks extend laterally from the dicing line into the semiconductor and insulating materials. Due to these cracks, moisture and contamination are free to penetrate active circuitry and start degrading the electrical device performance by a drastic amount. Even today, the generation of cracks is the most significant limitation with respect to the minimization of circuit chips. In addition, these cracks also represent significant reliability risks, since they tend to grow and widen under thermal and mechanical stress and thus eventually imperil the functionality of the integrated circuit.

It has been found that the so-called "interface de-lamination" phenomenon occurs between low-k dielectric layers during or after the wafer dicing process is performed, which causes performance degradation of the IC chips. In light of the above, the industry still requires a solution to the undesired propagation of interface de-lamination between low-k dielectric layers originating from the wafer dicing process.

SUMMARY OF THE INVENTION

The present invention in a first aspect therefore proposes a semiconductor structure with a crack stop structure. The semiconductor structure includes a matrix, an integrated circuit and a scribe line. The matrix includes a scribe line region and a circuit region. The integrated circuit is disposed within the circuit region. The scribe line is disposed within the scribe line region and includes a crack stop trench disposed in the matrix and adjacent to the circuit region. The crack stop trench is parallel with one side of the integrated circuit and filled with a dielectric material.

In one embodiment of the present invention, the semiconductor structure further includes a test pad disposed within the scribe line region.

In another embodiment of the present invention, the semiconductor structure further includes a guard ring surrounding the circuit region.

In another embodiment of the present invention, the dielectric material is selected from one of a porous low k material, polyimide, silicon oxide, silicon nitride and silicon oxynitride.

In another embodiment of the present invention, the matrix includes an interlayer dielectric layer, an intermetal dielectric layer and a shallow trench isolation so that the crack stop trench penetrates at least one of the interlayer dielectric layer, the intermetal dielectric layer and the shallow trench isolation to be embedded in the matrix.

In another embodiment of the present invention, the crack stop trench has a width at least one tenth of that of the scribe line.

In another embodiment of the present invention, the crack stop trench includes a multi-layer structure and at least one layer in the multilayer structure is not flat.

In another embodiment of the present invention, the surface of the dielectric material is lower than that of the scribe line.

In another embodiment of the present invention, the surface of the dielectric material is higher than that of the scribe line.

In another embodiment of the present invention, the semiconductor structure further includes a side crack stop trench embedded in the matrix and filled with the dielectric material so that the crack stop trench is disposed between the side crack stop trench and the integrated circuit.

The present invention in a second aspect proposes a method for forming a crack stop structure in a scribe line. First, a substrate including a scribe line region and a circuit region is provided. An integrated circuit is formed within the circuit region. An interlayer dielectric layer is formed on the substrate to cover the integrated circuit. Next, an intermetal dielectric layer is formed on the interlayer dielectric layer. A crack stop trench is formed within the scribe line region and penetrates at least one of the interlayer dielectric layer and the intermetal dielectric layer. The crack stop trench is then filled with a dielectric material to form a crack stop structure.

In one embodiment of the present invention, the dielectric material is selected from one of a porous low k material, polyimide, oxide, nitride and oxynitride.

In another embodiment of the present invention, the crack stop trench has a width at least one tenth of that of the scribe line.

In another embodiment of the present invention, the surface of the dielectric material is lower than that of the intermetal dielectric layer.

In another embodiment of the present invention, the surface of the dielectric material is higher than that of the intermetal dielectric layer.

The present invention in a third aspect proposes method for forming a crack stop structure in a scribe line. First, a substrate including a scribe line region, a circuit region and a first trench is provided. An integrated circuit is formed within the circuit region. An interlayer dielectric layer is formed on the substrate to cover the integrated circuit. The interlayer dielectric layer includes a second trench disposed within the scribe line region and connecting the first trench. An intermetal dielectric layer is formed on the interlayer dielectric layer. The interlayer dielectric layer includes a third trench disposed within the scribe line region and connecting the second trench. A crack stop structure is then formed within the first trench, the second trench and the third trench and consists of a dielectric material.

In one embodiment of the present invention, the dielectric material is oxide.

In another embodiment of the present invention, the crack stop trench has a width at least one tenth of that of the scribe line.

In another embodiment of the present invention, the method for forming a crack stop structure in a scribe line may further include forming the interlayer dielectric layer of the dielectric material to partially fill the first trench to form the second trench and forming the intermetal dielectric layer of the dielectric material to partially fill the second trench to form the third trench and forming the crack stop structure at the same time so that the surface of the dielectric material in the third trench is lower than that of the remaining intermetal dielectric layer.

In another embodiment of the present invention, the method for forming a crack stop structure in a scribe line may further include forming the interlayer dielectric layer of the dielectric material to partially fill the first trench to form the second trench, forming the intermetal dielectric layer of the dielectric material to partially fill the second trench to form the third trench and filling the third trench with the dielectric material to form the crack stop structure so that the surface of the dielectric material is higher than that of the intermetal dielectric layer.

In another embodiment of the present invention, the method for forming a crack stop structure in a scribe line may further include filling the first trench with the dielectric material before forming the interlayer dielectric layer, filling the second trench with the dielectric material before forming the intermetal dielectric layer, and filling the third trench with the dielectric material to form the crack stop structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
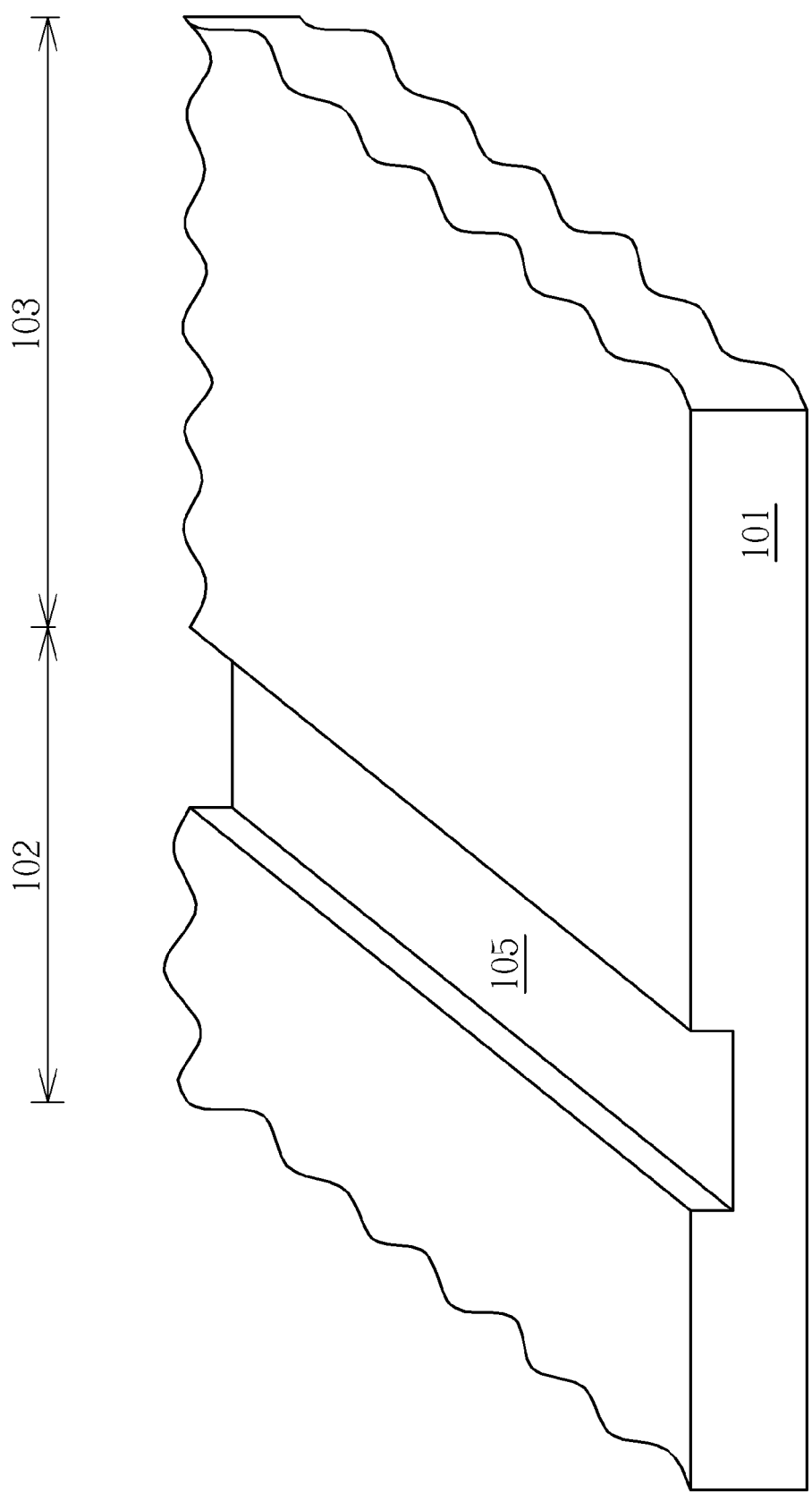
FIGS. 1-7 illustrate a method for forming a crack stop structure in a scribe line of the present invention.

The present invention in a first aspect provides a method for forming a crack stop structure in a scribe line. FIGS. 1-7 illustrate this method. There are various possible embodiments in the method of the present invention. First, as shown in FIG. 1, a substrate 101 is provided. The substrate 101 may be a semiconductive material, such as Si, and includes at least two regions, namely a scribe line region 102 and a circuit region 103. The circuit region 103 is used to accommodate an integrated circuit such as a MOS device or a flash memory cell. The scribe line region 102 is used to accommodate a scribe line for dicing the substrate 101. Optionally, a first trench 105 for use as a shallow trench isolation may be disposed in the substrate 101.

Figure 2A:
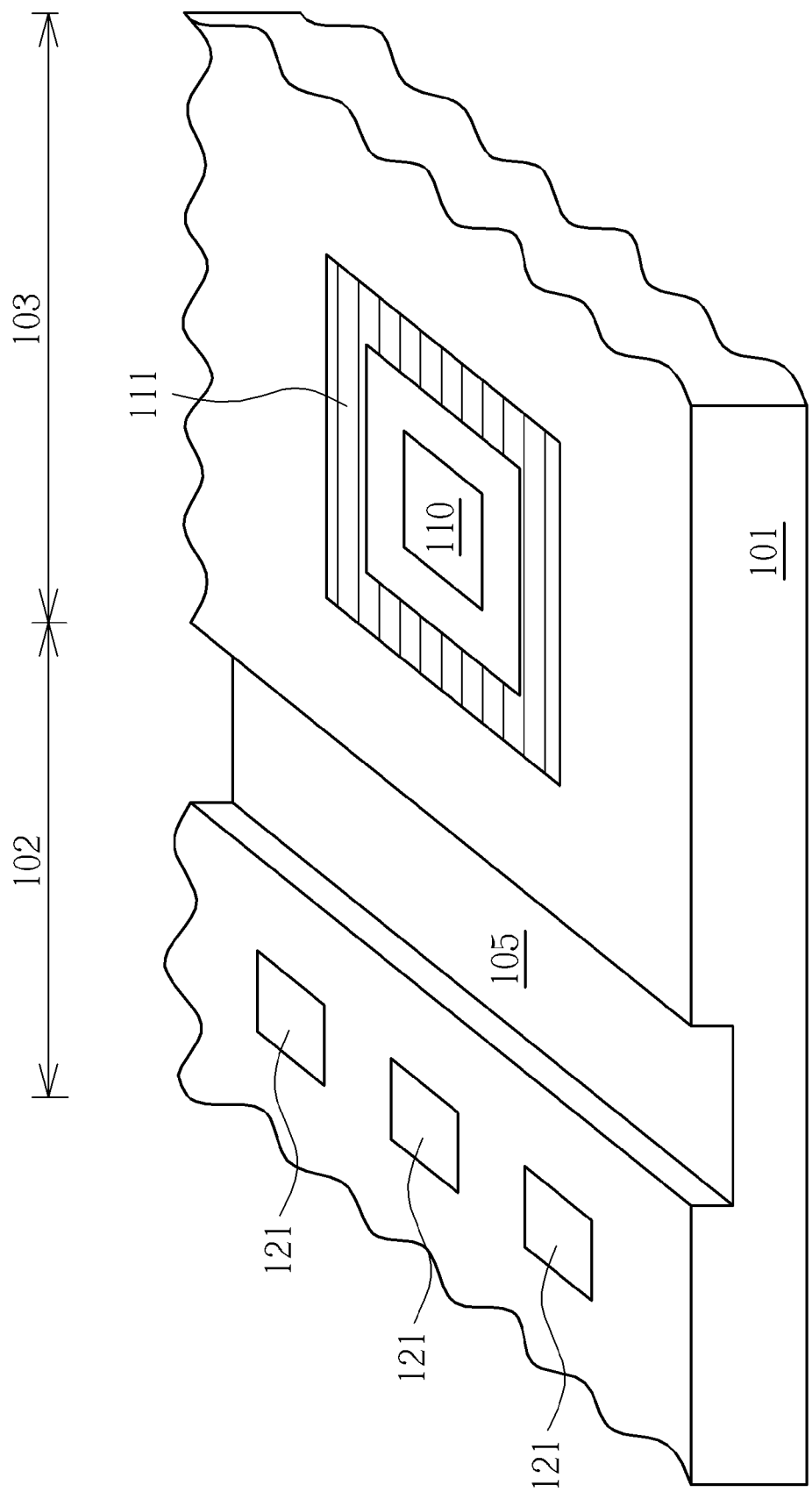
Figure 2B:
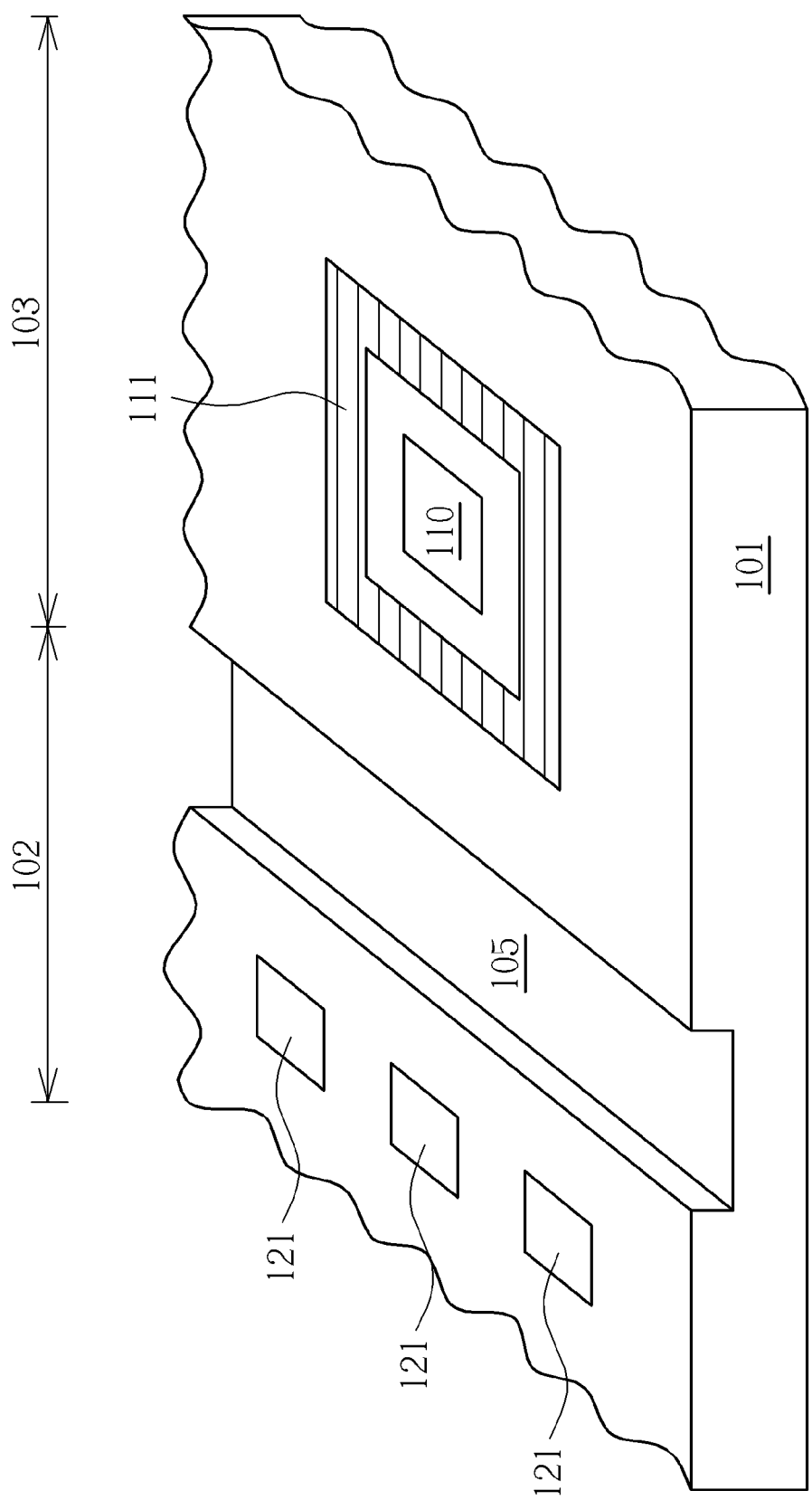
Figure 2C:
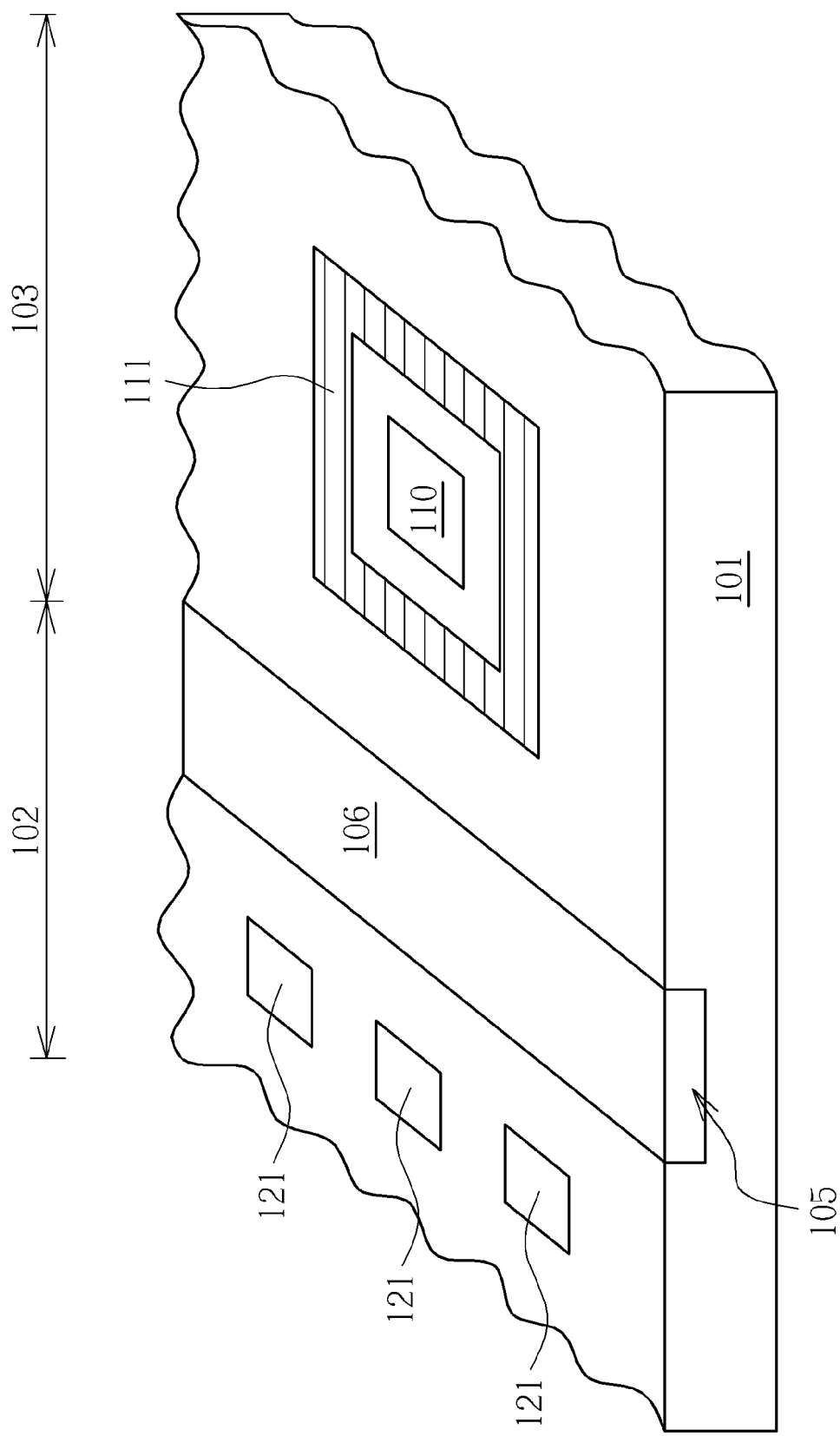

Since the circuit region 103 is used to accommodate an integrated circuit 110, as shown in FIG. 2A, an integrated circuit 110 is formed within the circuit region 103. The integrated circuit 110 may be a MOS device or a flash memory cell.

Optionally, a guard ring 111 may be formed to surround and protect the integrated circuit 110. Alternatively, a test pad 121 may be formed in the scribe line 102 on the substrate 101 for testing various circuits, as shown in FIG. 2A.

Figure 3A:
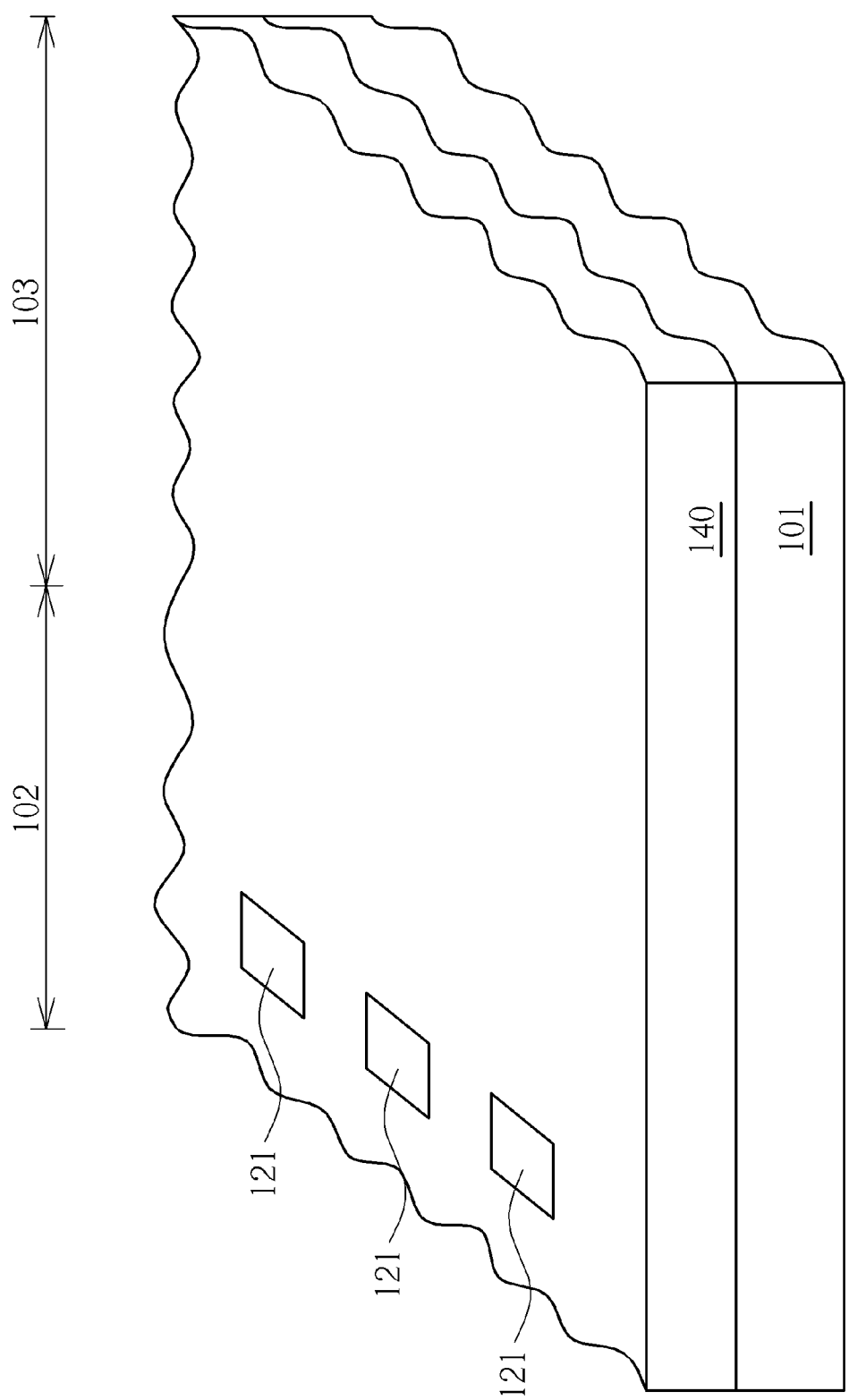
Figure 3B:
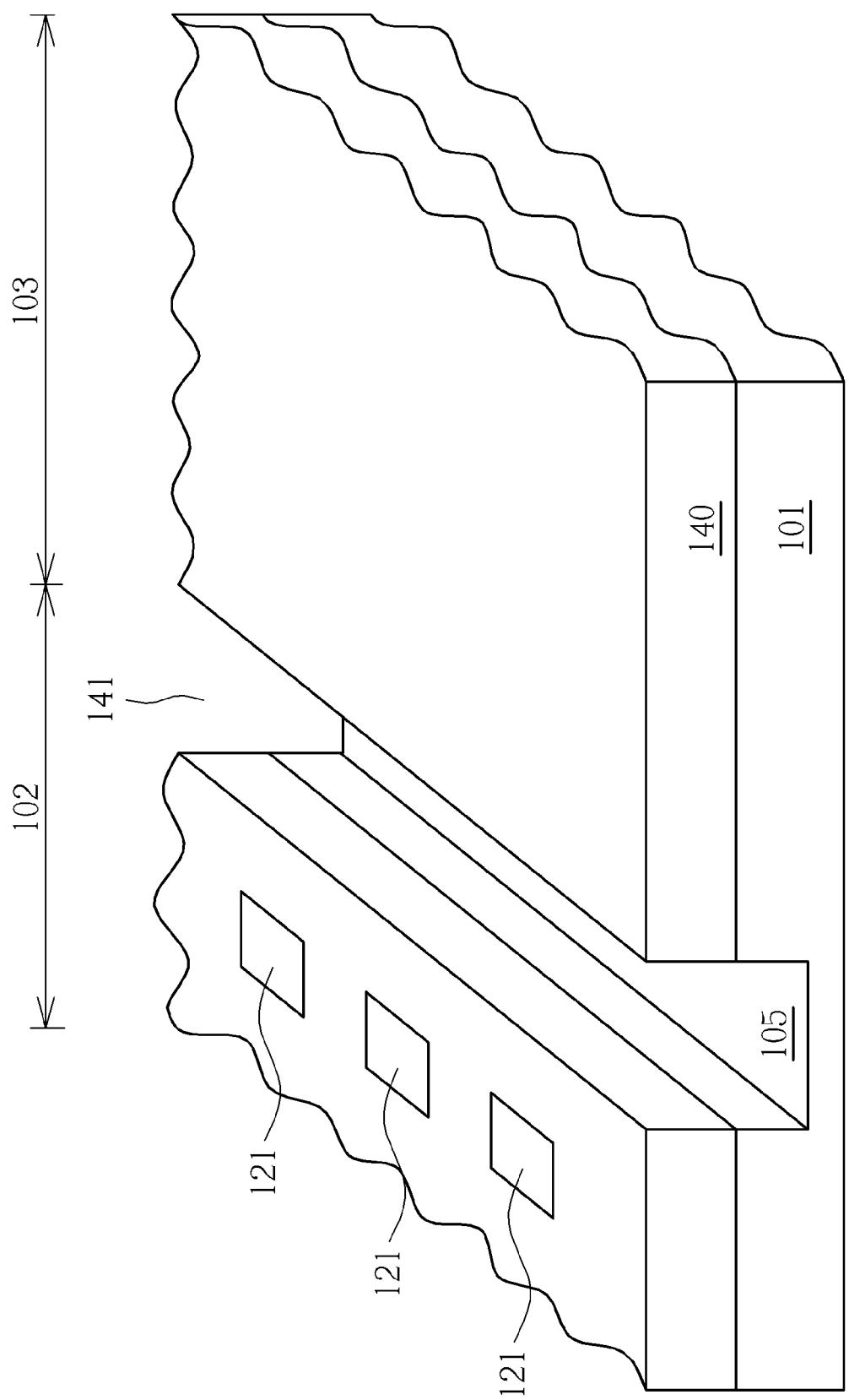

As shown in FIG. 3A, an interlayer dielectric layer 140 is formed to be disposed on the substrate 101 and cover the integrated circuit 110. Optionally, there may be a second trench 141 disposed in the interlayer dielectric layer 140 and connecting the first trench 105, as shown in FIG. 3B. The interlayer dielectric layer 140 may include an insulating material or a dielectric material, such as a porous low k material, polyimide, silicon oxide, silicon nitride and silicon oxynitride, but is preferably silicon oxide, and may be formed by chemical vapor deposition such as low pressure CVD (LP-CVD), atmosphere pressure CVD (AP-CVD) or plasma Enhanced CVD (PE-CVD).

Figure 4B:
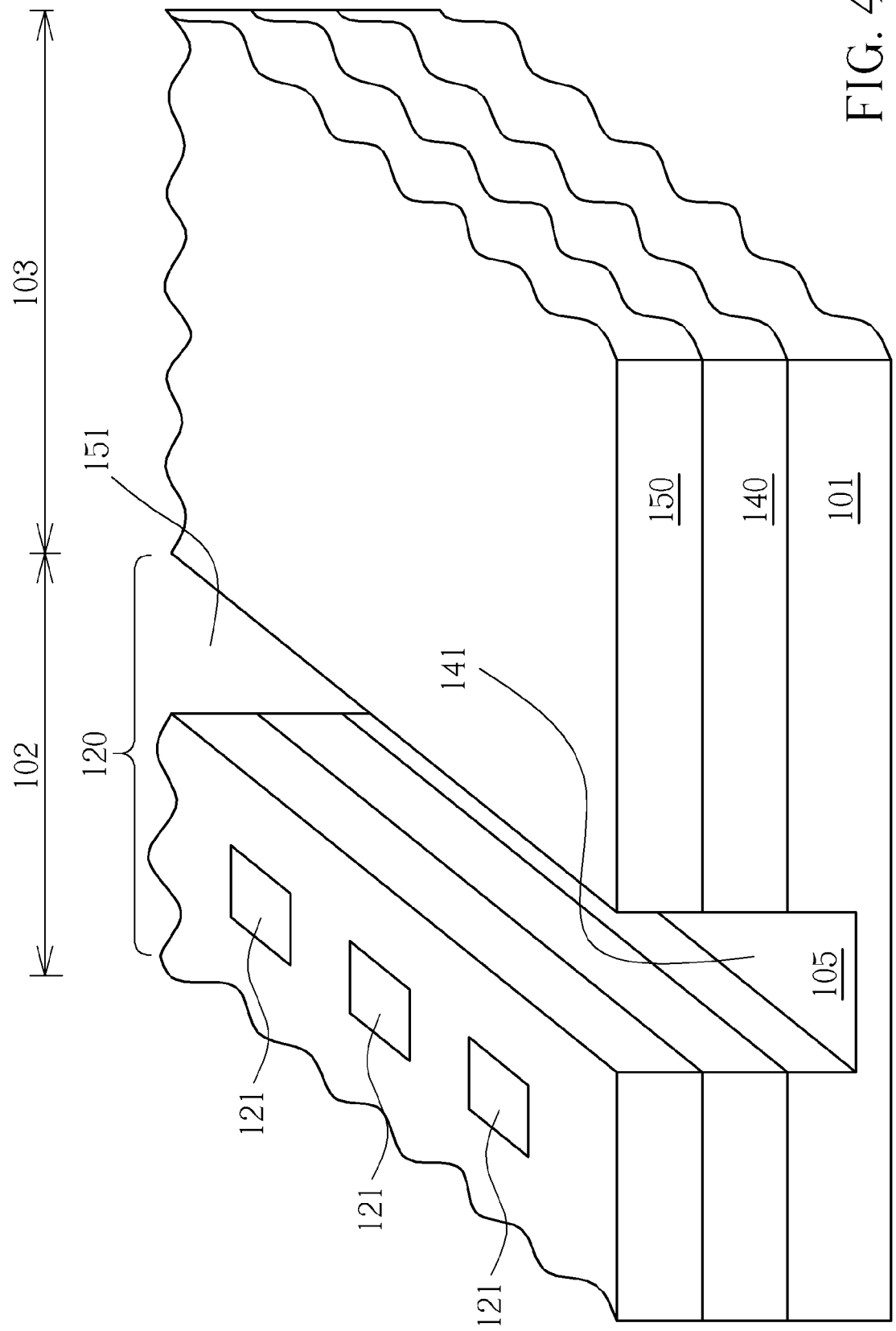

Then, as shown in FIG. 4A, an intermetal dielectric layer 150 is formed to be disposed on the interlayer dielectric layer 140. Optionally, there may be a third trench 151 disposed in the intermetal dielectric layer 150 and connecting the second trench 141, as shown in FIG. 4B. A scribe line 120 is also defined within the scribe line region 102 on the intermetal dielectric layer 150. The intermetal dielectric layer 150 may be formed by chemical vapor deposition such as low pressure CVD (LP-CVD), atmosphere pressure CVD (AP-CVD) or plasma Enhanced CVD (PE-CVD).

There may be multiple intermetal dielectric layers 150 disposed on the interlayer dielectric layer 140. Only one intermetal dielectric layers 150 is illustrated in FIG. 4B, however, for simplicity. The intermetal dielectric layer 150 may also include an insulating material or a dielectric material such as a porous low k material, polyimide, silicon oxide, silicon nitride or silicon oxynitride, but is preferably silicon oxide.

Figure 5:
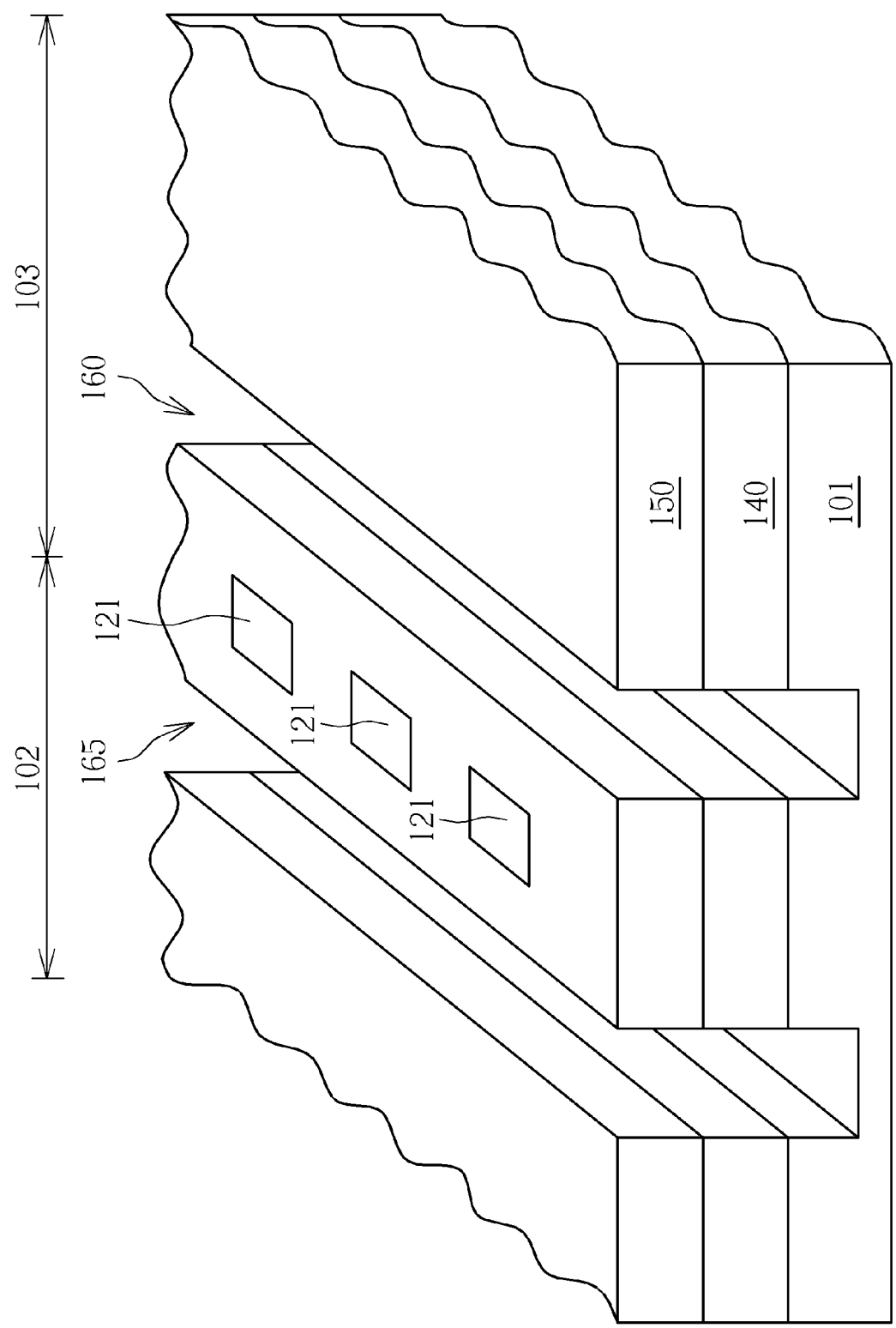

As shown in FIG. 5, if the first trench 105, the second trench 141 or the third trench 151 is not present, an etching step (such as a dry etching step) may be carried out to remove some of the interlayer dielectric layer 140, some of the intermetal dielectric layer 150 and/or the substrate 101, which are disposed within the scribe line region 102 for forming a crack stop trench 160 disposed within the scribe line region 102. The crack stop trench 160 penetrates the intermetal dielectric layer and at least one of the substrate 101, the interlayer dielectric layer.

When the crack stop trench 160 is prepared, the crack stop trench 160 is filled with a dielectric material 108 to form a crack stop structure 161 which is disposed within the scribe line region 102. The dielectric material may be a porous low k material, polyimide, silicon oxide, silicon nitride or silicon oxynitride. When the test pad 121 is present, the crack stop structure 161 may be disposed between the test pad 121 and the integrated circuit 110.

Preferably, the width of the crack stop trench 160 is not too small. For example, the crack stop trench 160 has a width at least one tenth of that of the scribe line 120.

Optionally, a side crack stop trench 165 may be formed to construct a side crack stop structure 166. The side crack stop structure 166 may be disposed inside or outside the scribe line region 102 to assist the crack stop structure 161 within the scribe line region 102. The side crack stop trench 165 and the side crack stop structure 166 may be formed by steps which are similar to those of the crack stop trench 160 and the crack stop structure 161.

For example, some of the interlayer dielectric layer 140 and some of the intermetal dielectric layer 150 are removed to form the side crack stop trench 165. If an optional shallow trench isolation 105 is present, the shallow trench isolation 105 may also be removed at the same time. Alternatively, there may be another first trench 105', a second trench 141' or a third trench 151' connecting with each other to form the side crack stop trench 165. The side crack stop trench 165 is filled with another dielectric material, such as a porous low k material, polyimide, silicon oxide, silicon nitride and/or silicon oxynitride to form a side crack stop structure 166.

Figure 6A:
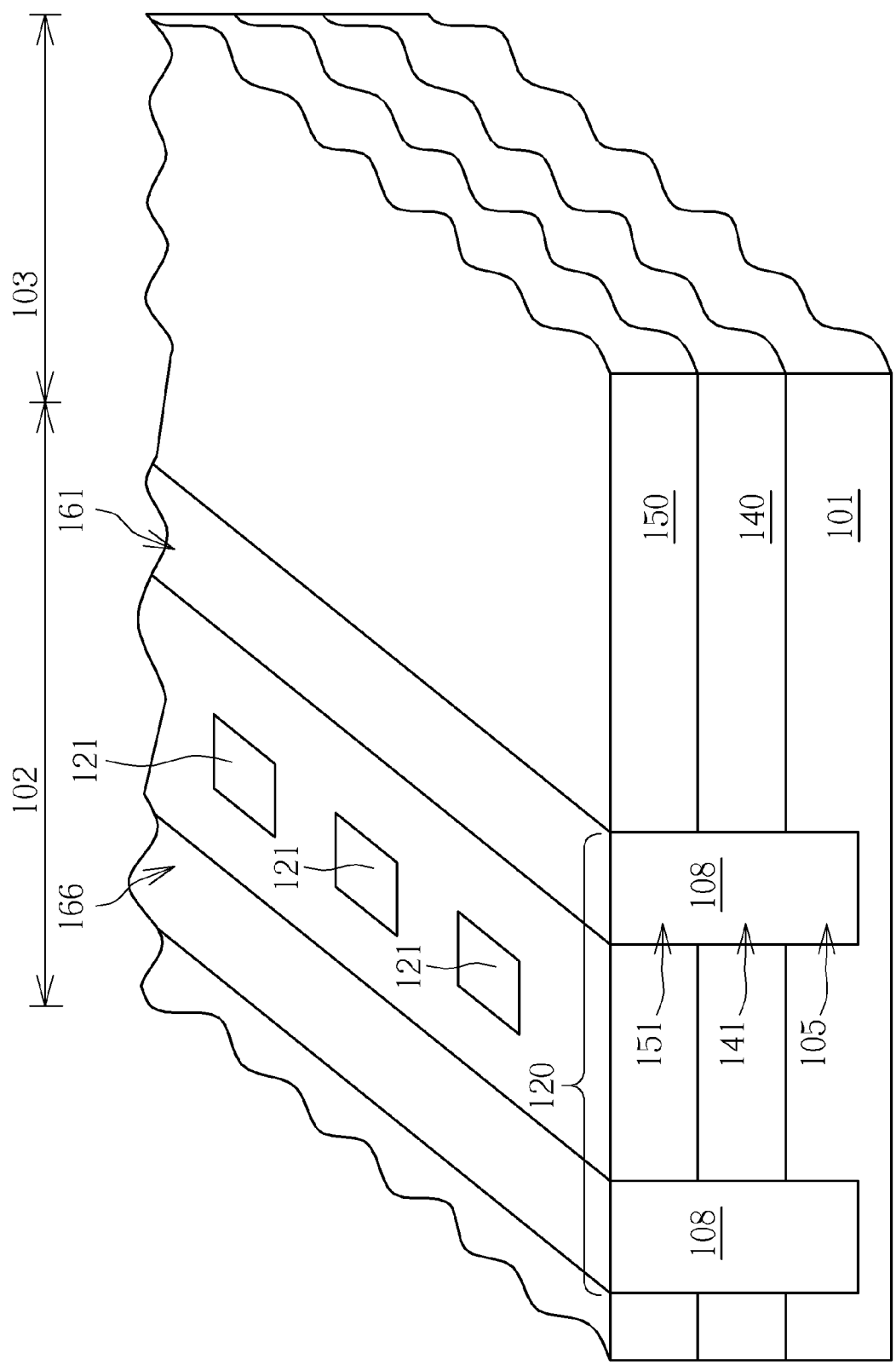

The dielectric material may fill the crack stop trench 160 and the optional side crack stop trench 165 in various different ways which represent various embodiments of the present invention. In a first embodiment, the dielectric material may directly fill the crack stop trench 160 and the optional side crack stop trench 165, as shown in FIG. 6A, so the crack stop structure 161 and the optional side crack stop structure 166 consist of a single dielectric material 108; this is preferably the same material as the interlayer dielectric layer 140 and the intermetal dielectric layer 150.

Figure 6B:
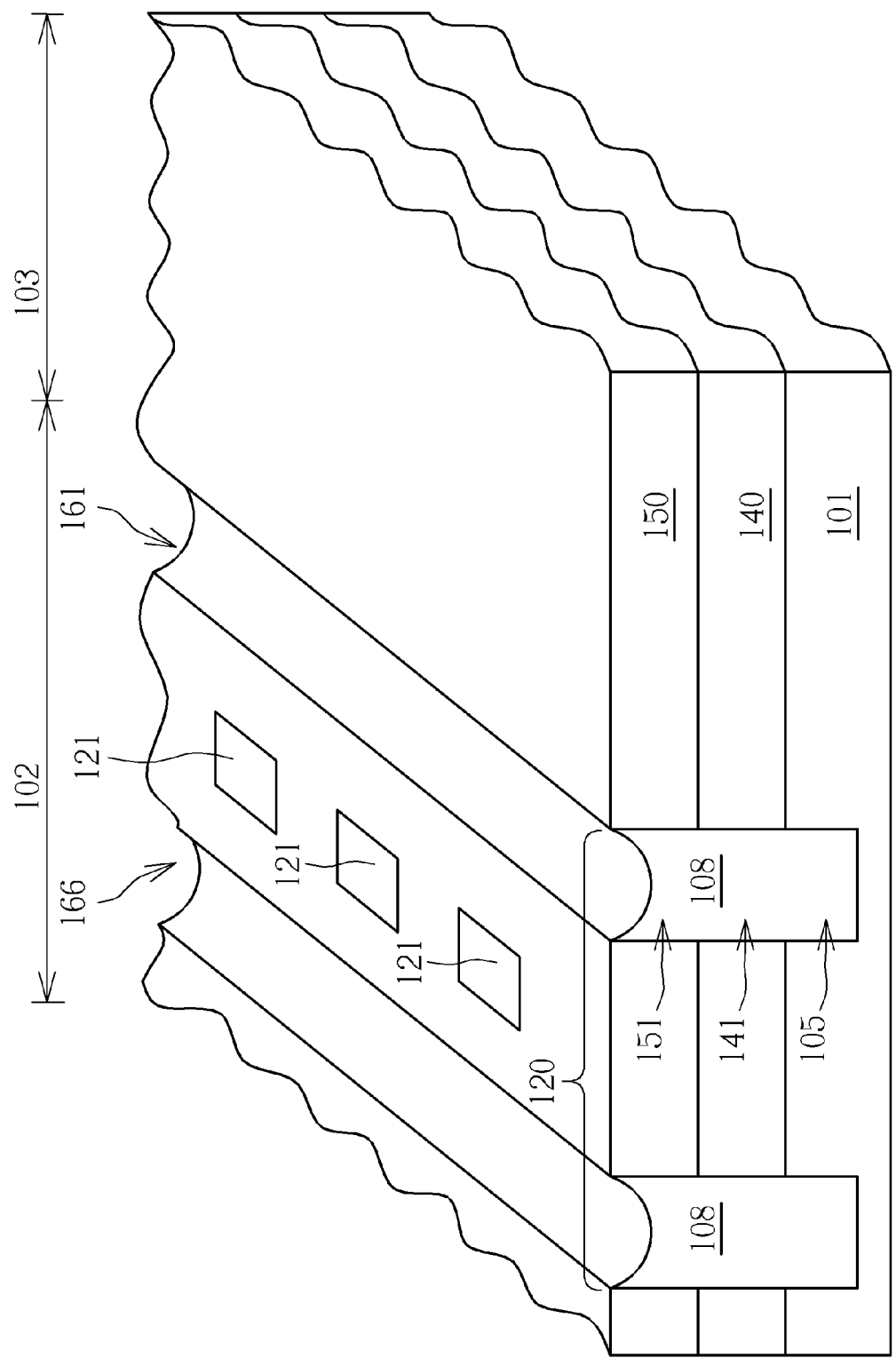

In another embodiment of the present invention, the surface of the dielectric material 108 may be lower than the surface of the intermetal dielectric layer 150, as shown in FIG. 6B. Alternatively, in another embodiment of the present invention, the surface of the dielectric material 108 may be higher than the surface of the intermetal dielectric layer 150, as shown in FIG. 6C.

Figure 3C:
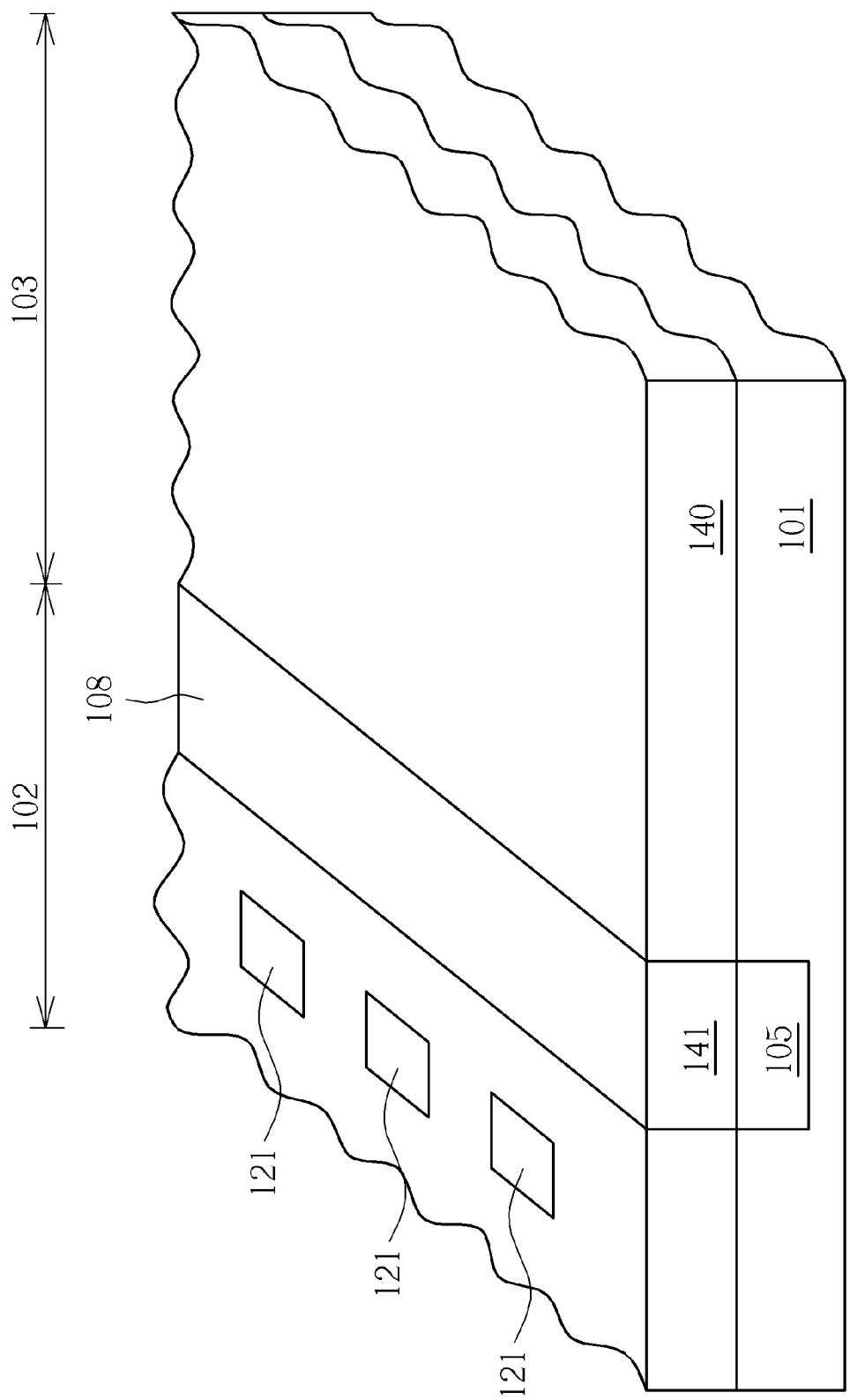
Figure 4C:
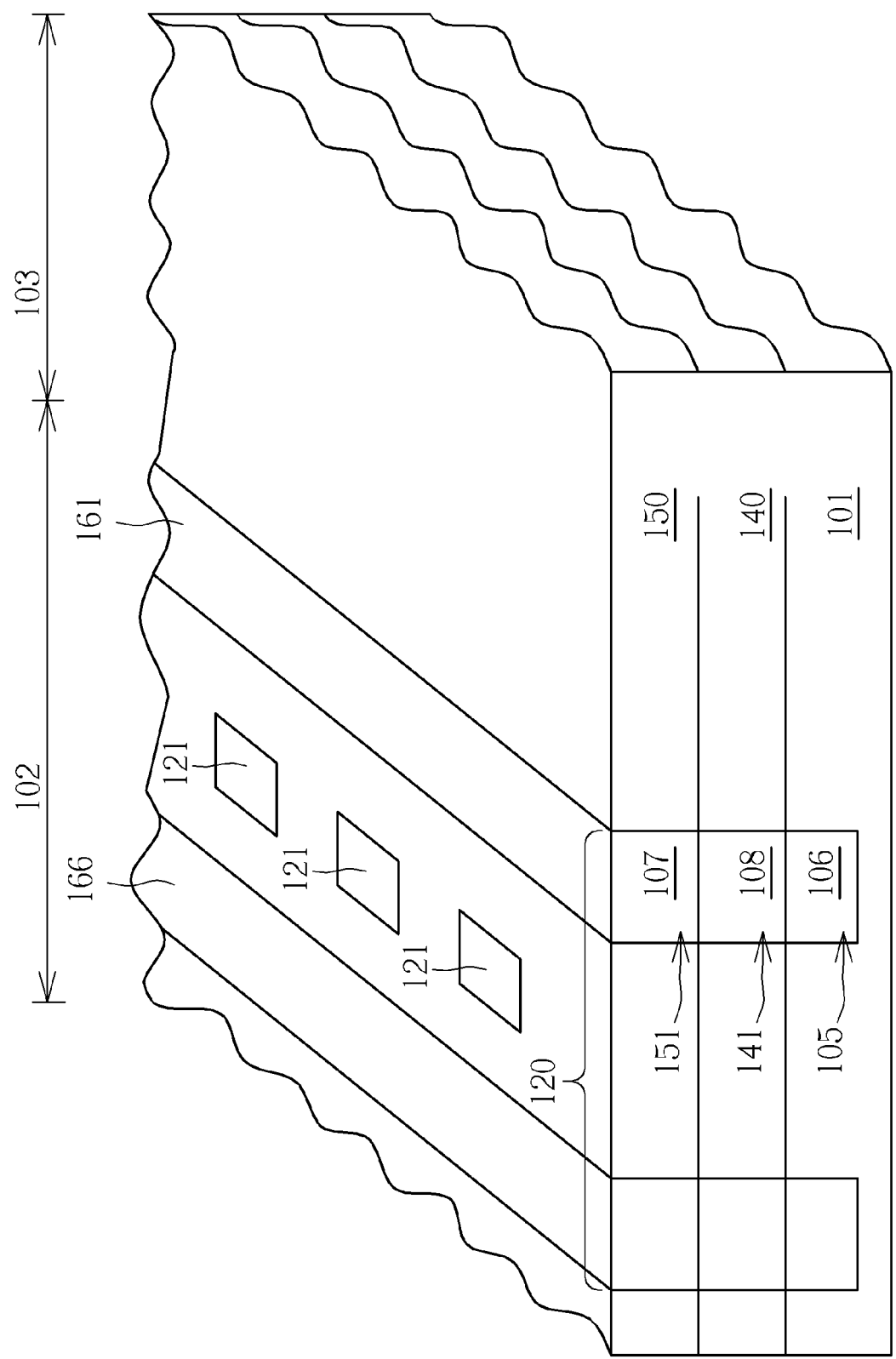

In a second embodiment of the present invention, the crack stop structure 161 and the optional side crack stop structure 166 may have a multi-layer structure. For example, if the first trench 105 is present, the interlayer dielectric layer 140 may be formed to partially fill the first trench 105 and to construct the second trench 141, as shown in FIG. 3C, so the surface within the scribe line 102 of the interlayer dielectric layer 140 may not be flat. Similarly, the intermetal dielectric layer 150 may be formed to partially fill the second trench 141 and to construct the third trench 151, as shown in FIG. 4C, so the surface within the scribe line 102 of the intermetal dielectric layer 150 may not be flat, either. Accordingly, the surface of the third trench 151 is possibly lower than the surface of the intermetal dielectric layer 150.

Figure 7:
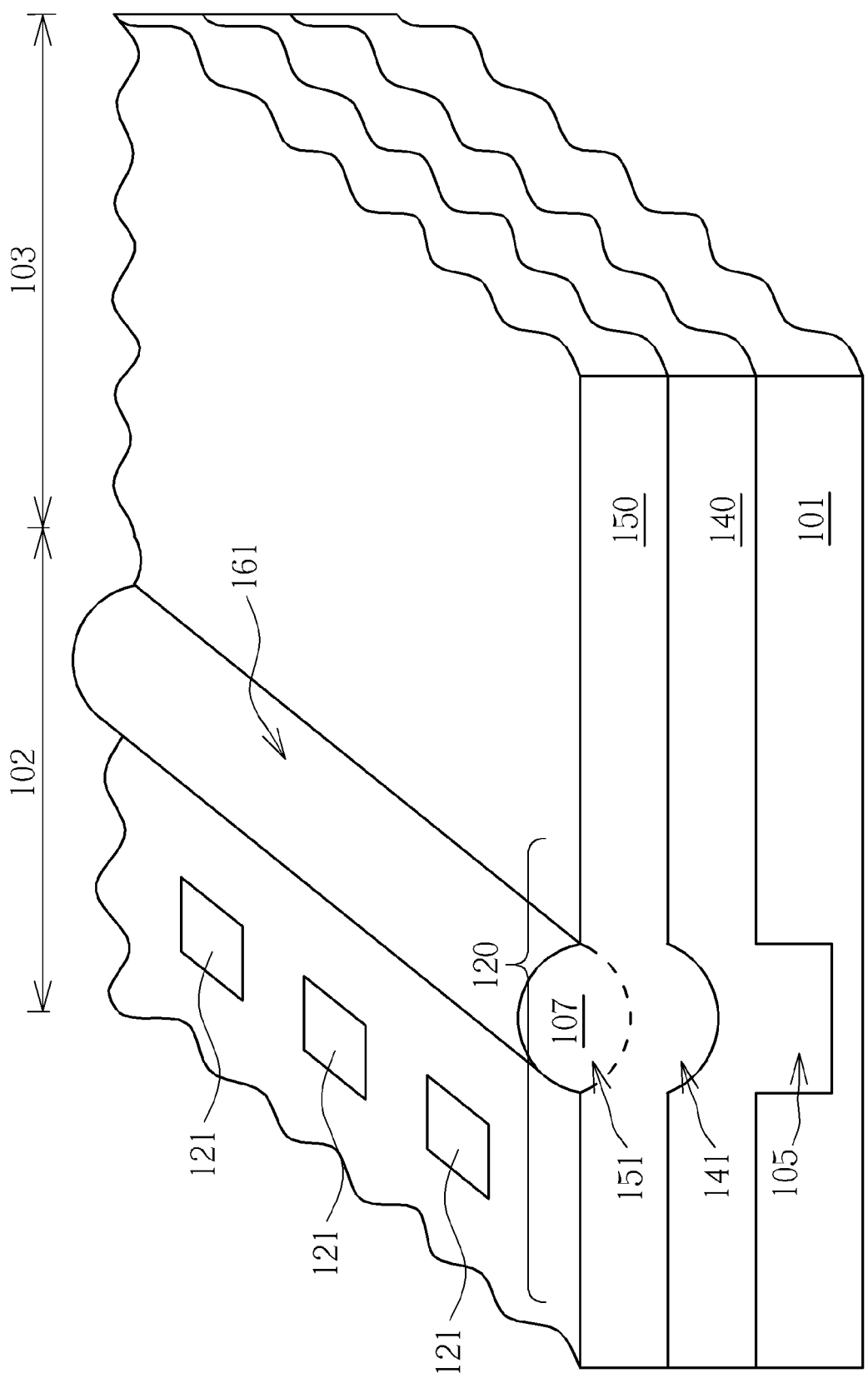

As shown in FIG. 7, the third trench 151 may be further filled up by another dielectric material 107, such as a porous low k material, polyimide, silicon oxide, silicon nitride and silicon oxynitride, so that the surface of the dielectric material 107 is higher than the surface of the intermetal dielectric layer 150.

In a third embodiment of the present invention, the crack stop structure 161 and the optional side crack stop structure 166 may have another multi-layer structure. If the first trench 105, the second trench 141 and the third trench 151 are present, the crack stop structure 161 and the optional side crack stop structure 166 may be formed sequentially. For example, the first trench 105 is filled up with the dielectric material 106 before the interlayer dielectric layer 140 is formed, as shown in FIG. 2D. Then, the second trench 141 is filled up with the dielectric material 108 before the intermetal dielectric layer 150 is formed, as shown in FIG. 3D. Later, the third trench 151 is filled up with the dielectric material 107 to form the crack stop structure 161 and the optional side crack stop structure 166, as shown in FIG. 4D.

Figure 8A:
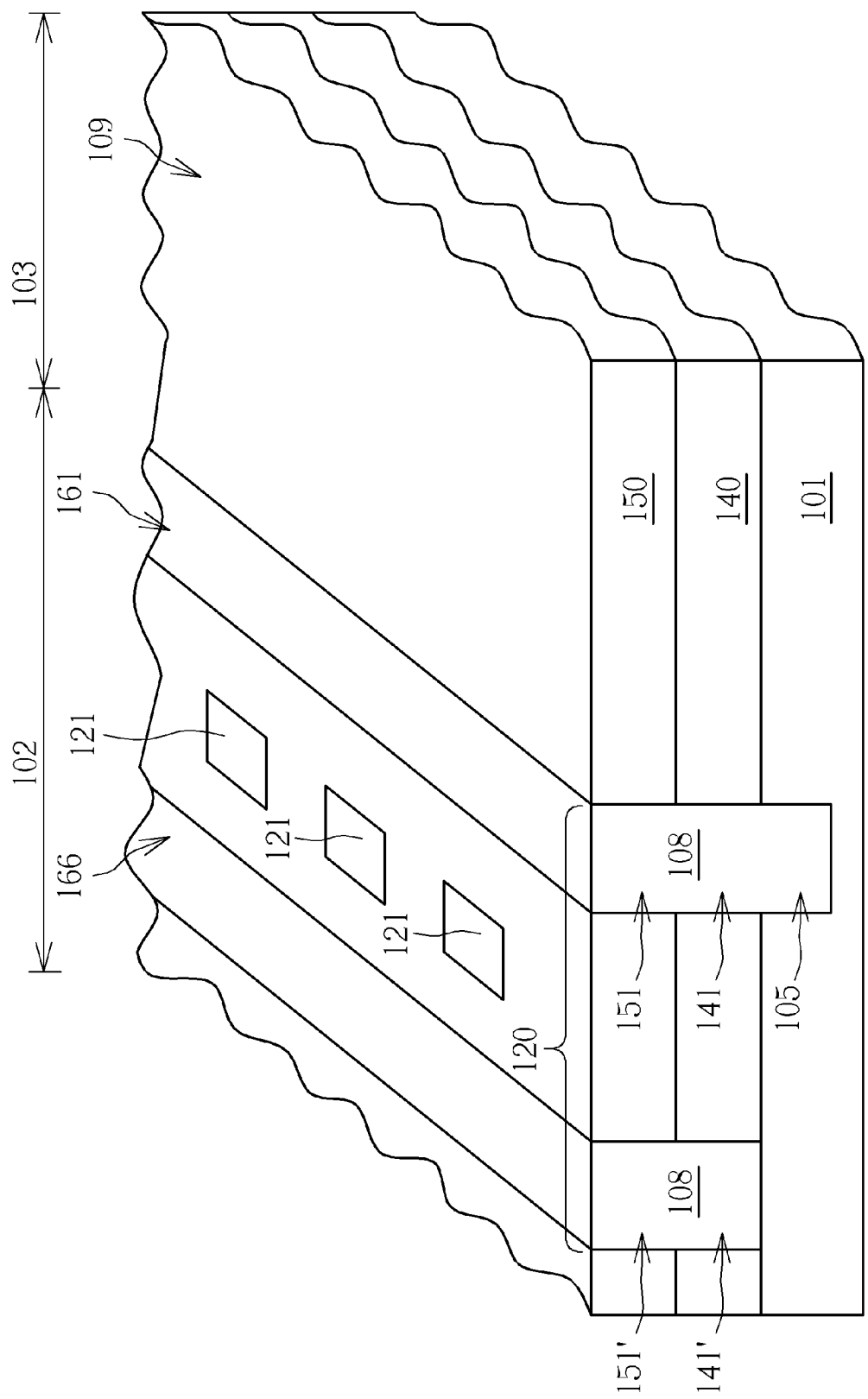
FIG. 8 illustrates the semiconductor structure with the crack stop structure of the present invention.
Figure 8B:
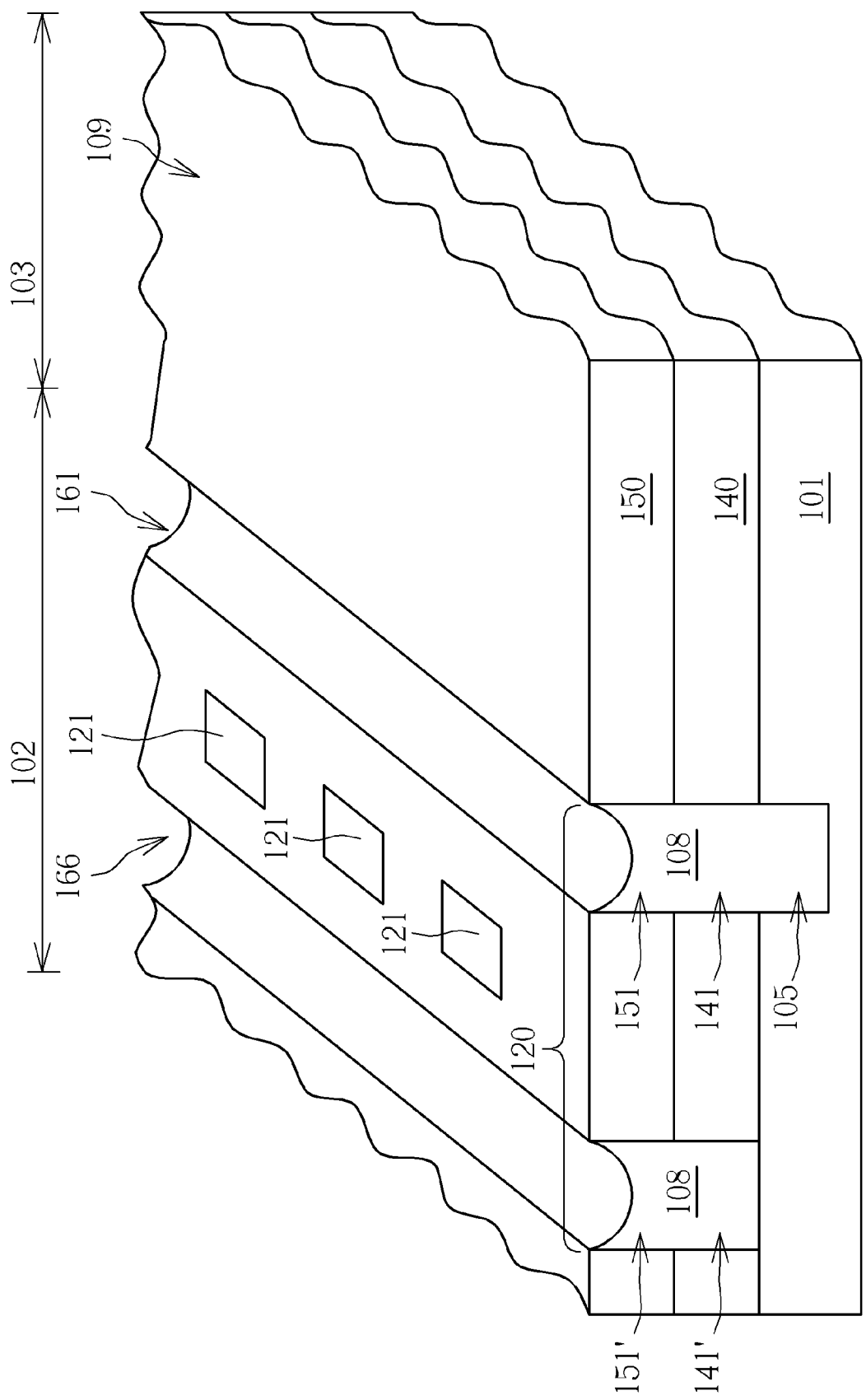
Figure 8C:
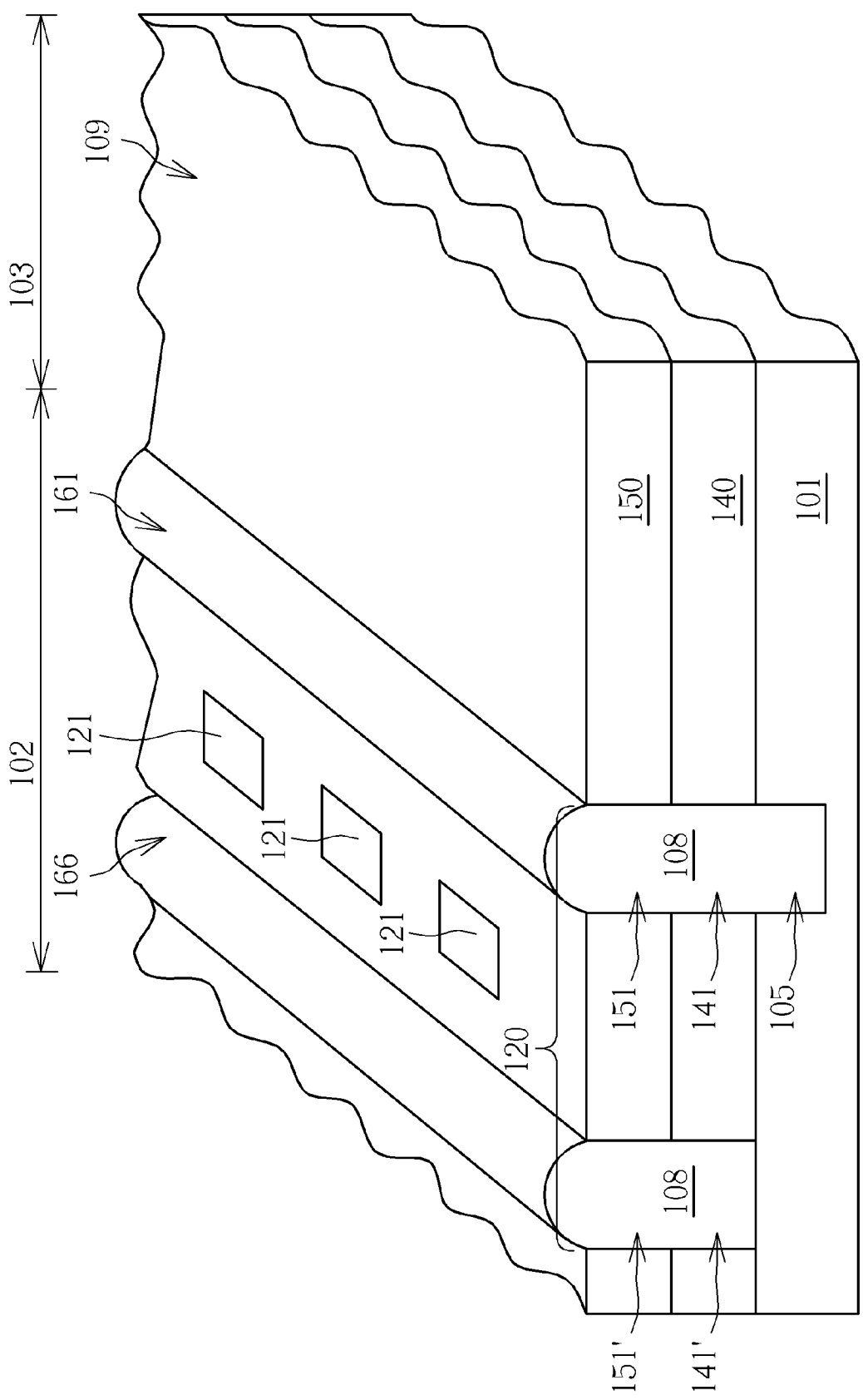

After the above-mentioned steps, a semiconductor structure 100 which includes a matrix 109, an integrated circuit 110 and a scribe line 120 is formed, as shown in FIG. 8. The matrix 109 includes the scribe line region 102, the circuit region 103, the interlayer dielectric layer 140, the intermetal dielectric layer 150, the optional first trench 105, the crack stop trench 160 and the crack stop structure 161.

The crack stop trench 160 is adjacent to the circuit region 103 and is parallel with one side of the circuit region 103. Preferably, the width of the crack stop trench 160 is not too small: for example, the crack stop trench 160 has a width at least one tenth of that of the scribe line 120. The crack stop trench 160 penetrates at least one of the interlayer dielectric layer 140 and the intermetal dielectric layer 150 or further to connect with the optional first trench 105 to be embedded in the matrix 109.

The crack stop trench 160 is filled with a single dielectric material, such as porous low k material, polyimide, silicon oxide, silicon nitride and silicon oxynitride, but is preferably silicon oxide.

Because the crack stop trench 160 and the optional side crack stop trench 165 are respectively formed in different steps, the formation of the trenches may help to release the stress within the interlayer dielectric layer 140, the intermetal dielectric layer 150 or the substrate 101. Accordingly, the crack stop structure 161 or the side crack stop structure 166 may help to stop the cracking from propagating to the circuit region 103 when the scribe line 120 on the matrix 109 is being diced in order to protect the integrated circuit 110 in the circuit region 103. When test pad 121 is present, the crack stop structure 161 may be disposed between the test pad 121 and the integrated circuit 110.

The crack stop structure 161 and the optional side crack stop structure 166 may have various structures which represent various embodiments of the present invention. In a first embodiment of the present invention, the dielectric material may directly fill the crack stop trench 160 and the optional side crack stop trench 165, as shown in FIG. 6A, so the crack stop structure 161 and the optional side crack stop structure 166 consist of a single dielectric material 108, which is preferably the same material as the interlayer dielectric layer 140 and the intermetal dielectric layer 150.

In one embodiment of the present invention, the surface of the dielectric material 108 may be lower than the surface of the intermetal dielectric layer 150, as shown in FIG. 6B. In another embodiment of the present invention, the surface of the dielectric material 108 may be higher than the surface of the intermetal dielectric layer 150, as shown in FIG. 6C.

In a second embodiment of the present invention, the crack stop structure 161 and the optional side crack stop structure 166 may have a multi-layer structure. The surface within the scribe line 102 of the interlayer dielectric layer 140 and the surface within the scribe line 102 of the intermetal dielectric layer 150 may not be flat, as shown in FIG. 4C. The third trench 151 may be further filled up by another dielectric material 107, such as a porous low k material, polyimide, silicon oxide, silicon nitride and silicon oxynitride, so that the surface of the dielectric material 107 is higher than the surface of the intermetal dielectric layer 150, as shown in FIG. 7.

In a third embodiment of the present invention, the crack stop structure 161 and the optional side crack stop structure 166 may have another multi-layer structure. If the first trench 105, the second trench 141 and the third trench 151 are present, the first trench 105 is filled up with the dielectric material 106, the second trench 141 is filled up with the dielectric material 108, and the third trench 151 is filled up with the dielectric material 107 to form the crack stop structure 161 and the optional side crack stop structure 166, as shown in FIG. 4D.

Those skilled in the art will readily observe that numerous modifications and alterations of the device and method may be made while retaining the teachings of the invention.

What is claimed is:

1. A semiconductor structure, comprising:
a substrate comprising a scribe line region and a die region;
a die disposed within said die region;
a scribe line disposed within said scribe line region;
a dielectric stack overlying the scribe line region and a die region;
a first crack stop trench in said scribe line region, wherein said first crack stop trench extends through the dielectric stack and recesses into said substrate, wherein said first crack stop trench is parallel with one side of said die; and
a dielectric material completely filling up said first crack stop trench.

2. The semiconductor structure of claim 1, further comprising:
a test pad disposed within said scribe line region.

3. The semiconductor structure of claim 1, further comprising:
a guard ring surrounding said die.

4. The semiconductor structure of claim 1, wherein said dielectric material is selected from one of a porous low k material, polyimide, silicon oxide, silicon nitride and silicon oxynitride.

5. The semiconductor structure of claim 1 further comprising a shallow trench isolation embedded in the substrate, wherein the dielectric stack comprises an interlayer dielectric layer on said shallow trench isolation, and an intermetal dielectric layer on said interlayer dielectric layer, and wherein said first crack stop trench penetrates at least one of said interlayer dielectric layer, said intermetal dielectric layer and recessed into said shallow trench isolation.

6. The semiconductor structure of claim 1, wherein said first crack stop trench has a width at least one tenth of that of said scribe line.

7. The semiconductor structure of claim 1, wherein said first crack stop trench has therein a multilayer structure and at least one layer in said multilayer structure has a recessed top surface.

8. The semiconductor structure of claim 1, wherein the surface of said dielectric material is lower than that of said scribe line.

9. The semiconductor structure of claim 1, wherein the surface of said dielectric material is higher than that of said scribe line.

10. The semiconductor structure of claim 1, further comprising:
a second crack stop trench within said scribe line region and filled with said dielectric material, wherein said second crack stop trench is in parallel with said first crack stop trench.

* * * * *